United States Patent
Palmer et al.

(10) Patent No.: US 7,670,749 B2
(45) Date of Patent: Mar. 2, 2010

(54) RESIST MATERIAL AND METHOD FOR FORMING A PATTERNED RESIST LAYER ON A SUBSTRATE

(75) Inventors: Richard Edward Palmer, Stourbridge (GB); Alex Robinson, Birmingham (GB); Jon Andrew Preece, Birmingham (GB)

(73) Assignee: The University of Birmingham, Birmingham (GB)

( * ) Notice: Subject to any disclaimer, the term of this patent is extended or adjusted under 35 U.S.C. 154(b) by 0 days.

(21) Appl. No.: 11/663,017

(22) PCT Filed: Sep. 19, 2005

(86) PCT No.: PCT/GB2005/003605

§ 371 (c)(1),
(2), (4) Date: Sep. 7, 2007

(87) PCT Pub. No.: WO2006/030239

PCT Pub. Date: Mar. 23, 2006

(65) Prior Publication Data

US 2007/0298328 A1 Dec. 27, 2007

(30) Foreign Application Priority Data

Sep. 17, 2004 (GB) ................... 0420704.9

(51) Int. Cl.
*G03F 7/004* (2006.01)
*G03F 7/30* (2006.01)

(52) U.S. Cl. ............... 430/270.1; 430/325; 430/330; 430/905; 430/914; 430/921

(58) Field of Classification Search ............. 430/270.1, 430/325, 330, 905, 914, 921
See application file for complete search history.

(56) References Cited

U.S. PATENT DOCUMENTS 5,202,216 A * 4/1993 Aotani et al. ............... 430/176
6,458,506 B2 * 10/2002 Cameron .................. 430/270.1
6,503,688 B1 1/2003 Preece et al. ............. 430/270.1

OTHER PUBLICATIONS

Tada et al. "*A Triphenylene Derivative as a Novel Negative/Positive Tone Resist of 10 Nanometer Resolution*," 2000, Microelectronic Engineering 53, pp. 425-428.

Robinson et al. "*Polysubstituted Derivatives of Triphenylene as High Resolution Electron Beam Resists for Nanolithography*," J. Vac. Sci. Technol. B 18(6), Nov./Dec. 2000, American Vacuum Society, pp. 2730-2736.

Robinson et al. "*Rapid Communication: 10nm Scale Electron Beam Lithography Using a triphenylene Derivatives as a Negative/Positive Tone Resist*," J. Phys. D: Appl. Phys. 32, May 10, 1999, pp. L75-L78.

International Search Report dated Sep. 3, 2006 in regards with PCT application No. PCT/GB2005/003605.

* cited by examiner

*Primary Examiner*—John S Chu
(74) *Attorney, Agent, or Firm*—Ohlandt, Greeley, Ruggiero & Perle, L.L.P.

(57) ABSTRACT

A method for the formation of a patterned resist layer on a substrate surface by patternwise irradiation with actinic radiation. The first step of the method is formation of a coating layer comprising a substituted triphenylene compound having a diameter of between 1 and 3 nm, a sensitizer which increases the sensitivity of the exposed layer to the actinic radiation used in a subsequent irradiation step and a cross-linker on the substrate surface. Subsequently the coating layer is irradiated patternwise, and unirradiated areas of the coating layer are removed. A resist material comprising a solution of: (i) as the principal resist material a triphenylene derivative having a diameter of from 1 to 3 rim, (ii) a sensitizer which increases the sensitivity of the resist material to actinic radiation, and (iii) a cross-linker capable of cross-linking molecules of the triphenyl derivative, the cross-linker optionally being constituted by a moiety attached to the triphenylene derivative.

22 Claims, 2 Drawing Sheets

RESIST MATERIAL AND METHOD FOR FORMING A PATTERNED RESIST LAYER ON A SUBSTRATE

BACKGROUND OF THE DISCLOSURE

1. Field of the Disclosure

The present invention relates to a resist material, particularly but not exclusively an electron beam resist material, and to a method for forming a finely patterned resist layer on a substrate surface using the resist material.

2. Description of the Related Art

As is well known, the manufacturing process of various kinds of electronic or semiconductor devices such as ICs, LSIs and the like involves a fine patterning of a resist layer on the surface of a substrate material such as a semiconductor silicon wafer. This fine patterning process has traditionally been conducted by the photolithographic method in which the substrate surface is uniformly coated with a positive or negative tone photoresist composition to form a thin layer of the photoresist composition and selectively irradiating with actinic rays (such as ultraviolet light) through a photomask followed by a development treatment to selectively dissolve away the photoresist layer in the areas exposed or unexposed, respectively, to the actinic rays leaving a patterned resist layer on the substrate surface. The thus obtained patterned resist layer is utilized as a mask in the subsequent treatment on the substrate surface such as etching.

The fabrication of structures with dimensions of the order of nanometers is an area of considerable interest since it enables the realization of electronic and optical devices which exploit novel phenomena such as quantum confinement effects and also allows greater component packing density. As a result, the resist layer is required to have an ever increasing fineness which can by accomplished only by using actinic rays having a shorter wavelength than the conventional ultraviolet light. Accordingly, it is now the case that, in place of the conventional ultraviolet light, electron beams (e-beams), excimer laser beams, EUV and X-rays are used as the short-wavelength actinic rays. Needless to say the minimum size obtainable is primarily determined by the performance of the resist material and the wavelength of the actinic rays.

Various materials have been proposed as suitable resist materials. These include organic resinous materials such as methacrylic resin-based, polystyrene-based and novolac resin based materials. In the case of negative tone resists based on polymer crosslinking, there is an inherent resolution limit of about 10 nm, which is the approximate radius of a single polymer molecule.

It is also known to apply a technique called "chemical amplification" to the polymeric resist materials. A chemically amplified resist material is generally a multi-component formulation in which there is a main polymeric component, such as a novolac resin which contributes towards properties such as resistance of the material to etching and its mechanical stability and one or more additional components which impart desired properties to the resist and a sensitizer. By definition, the chemical amplification occurs through a catalytic process involving the sensitizer which results in a single irradiation event causing exposure of multiple resist molecules. In a typical example the resist comprises a polymer and a photoacid generator (PAG) as sensitizer. The PAG releases a proton in the presence of radiation (light or e-beam). This proton then reacts with the polymer to cause it to lose a dissolution inhibiting functional group. In the process, a second proton is generated which can then react with a further molecule. The speed of the reaction can be controlled, for example, by heating the resist film to drive the reaction. After heating, the reacted polymer molecules are soluble in a developer whilst the unreacted polymer is not (i.e. positive tone resist). In this way the sensitivity of the material to actinic radiation is greatly increased, as small numbers of irradiation events give rise to a large number of exposure events.

In other chemical amplification schemes, irradiation results in cross-linking of the exposed resist material, thereby creating a negative tone resist. The polymeric resist material may be self cross-linking or a cross linking molecule may be included. Chemical amplification of polymeric-based resists is disclosed in U.S. Pat. No. 5,968,712, U.S. Pat. No. 5,529,885, U.S. Pat. No. 5,981,139 and U.S. Pat. No. 6,607,870.

Other materials have been investigated as potential resist materials, including low molecular weight organic molecules (Yoshiiwa M, et. al., Appl. Phys. Lett. 69 (1996) 2605) and inorganic substances such as metal fluorides (Fujita J, et. al., Appl. Phys. Lett. 66 (1995) 3064). $C_{60}$ (fullerene) demonstrates negative tone behaviour, but has low sensitivity (critical dose about $1 \times 10^{-2}$ $C/cm^2$). Various methanofullerene derivatives were subsequently shown to be useful e-beam resist materials by the present inventors, Appl. Phys. Lett. volume 72, page 1302 (1998), Appl. Phys. Lett. volume 312, page 469 (1999), Mat. Res. Soc. Symp. Proc. volume 546, page 219 (1999) and U.S. Pat. No. 6,117,617.

The present inventors have also previously reported on the use of certain polysubstituted triphenylene derivatives as electron beam resist materials as exemplified by EP 01159649 and "Polysubstituted Derivatives of triphenylene as High Resolution Electron Beam Resists for Nanolithography", A. P. G. Robinson, et al, J. Vac. Sci. Tech. B, 18, No. 6, 2730-2736, (2000).

These materials are cast in chloroform, toluene or monochlorobenzene and developed in certain alcohols (positive tone) or monochlorobenzene (negative tone).

It is an object of the present invention in one aspect to provide a novel photoresist material which obviates or mitigates one or more disadvantages associated with prior art resist materials.

SUMMARY OF THE DISCLOSURE

According to a first aspect of the invention there is provided a method for the formation of a patterned resist layer on a substrate surface by patternwise irradiation with actinic radiation comprising the steps of:—

(i) forming a coating layer comprising a substituted triphenylene compound having a diameter of between 1 and 3 nm, a sensitizer which increases the sensitivity of the exposed layer to the actinic radiation of step (ii) and a cross-linker on the substrate surface, (ii) irradiating the coating layer patternwise, and (iii) removing unirradiated areas of the coating layer.

The preferred mass ratio of triphenylene to sensitizer is from about 1:0.1 to 1:0.5.

According to a second aspect of the present invention, there is provided a resist material comprising a solution of:—

(i) as the principal resist material a triphenylene derivative having a diameter of from 1 to 3 nm, (ii) a sensitizer which increases the sensitivity of the resist material to actinic radiation, and (iii) a cross linker capable of cross linking molecules of the triphenylene derivative, said cross linker optionally being constituted by a moiety attached to said triphenylene derivative.

DETAILED DESCRIPTION OF THE DISCLOSURE

Figure 1:
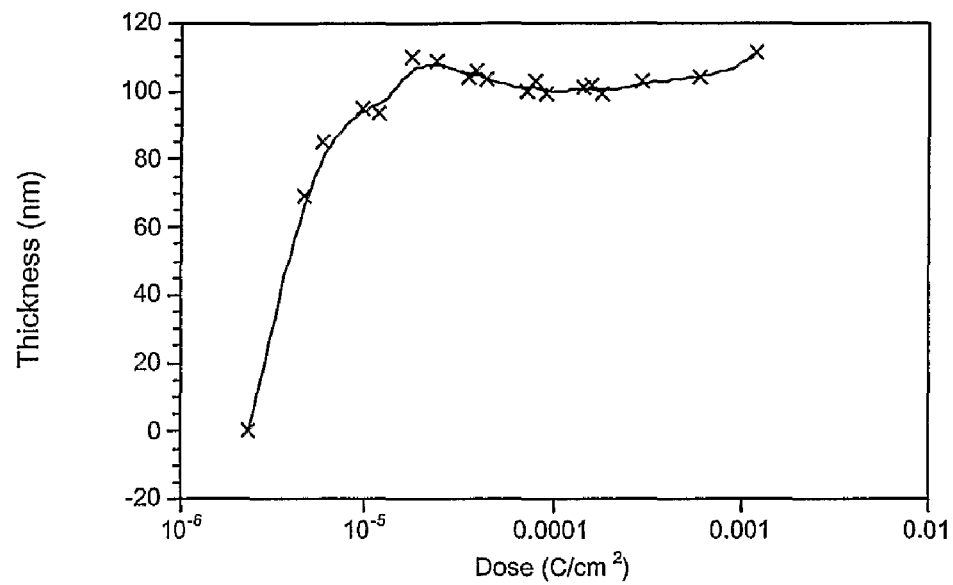
FIGS. 1 to 3 are plots of film thickness against dose for resist materials in accordance with the present invention exposed to electron beam irradiation at 20 keV and developed in MCB.

According to a first aspect of the invention there is provided a method for the formation of a patterned resist layer on a substrate surface by patternwise irradiation with actinic radiation comprising the steps of:—

(i) forming a coating layer comprising a substituted triphenylene compound having a diameter of between 1 and 3 nm, a sensitizer which increases the sensitivity of the exposed layer to the actinic radiation of step (ii) and a cross-linker on the substrate surface, (ii) irradiating the coating layer patternwise, and (iii) removing unirradiated areas of the coating layer.

The preferred mass ratio of triphenylene to sensitizer is from about 1:0.1 to 1:0.5.

The sensitizer may be a photoinitiator such as a triarylsulfonium hexafluoroantimonate salts (e.g. Dow UVI-6976) or 3,6-bis(2-methyl-2-morpholinopropionyl)-9-octylcarbazole (Sigma Aldrich), or a photo acid generator (PAG).

Suitable PAGs are described in U.S. Pat. No. 6,607,870 (incorporated herein by reference) and include non-ionic, organic acid generators. Specific non-ionic organic acid generators include halogenated non-ionic compounds such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclododecane; 1,10-dibromodecane; 1,1-bis[p-chlorophenyl]2,2-dichloroethane; 4,4'-dichloro-2-(trichloromethyl)benzhydrol or 1,1-bis(chlorophenyl)2-2,2-trichloroethanol; hexachlorodimethylsulfone; 2-chloro-6-(trichloromethyl) pyridine; O,O-diethyl-O-(3,5,6-trichloro-2-pyridyl)phosphorothioate; 1,2,3,4,5,6-hexachlorocyclohexane; N(1,1-bis [p-chlorophenyl]-2,2,2-trichloroethylacetamide; tris[2,3-dibromopropyl]isocyanurate; 2,2-bis[p-chlorophenyl]-1,1-dichloroethylene. Suitable photoacid generators are also disclosed in European Patent Application Nos. 0164248 and 0232972. Especially preferred is triphenylsulphonium triflate.

Amine-based crosslinkers are preferred. Suitable amine-containing crosslinkers include urea-formaldehyde, melamine-formaldehyde, benzoguanamine-formaldehyde, glycoluril-formaldehyde resins and combinations thereof. Other suitable amine-based crosslinkers include the melamines manufactured by American Cyanamid Company such as Cymel™ 300, 301, 303, 350, 370, 380, 1116 and 1130; benzoguanamine resins such as Cymel™ 1123 and 1125; glycoluril resins Cymel™ 1170, 1171, 1172; and urea-based resins Beetle™ 60, 65 and 80. A large number of similar amine-based compounds are presently commercially available from various suppliers. As known to those in the art, polymeric amine-based resins may be prepared by the reaction of acrylamide or methacrylamide copolymers with formaldehyde in an alcohol-containing solution, or alternatively by the copolymerization of N-alkoxymethyl acrylamide or methacrylamide with other suitable monomers.

Of the above crosslinkers, the melamines are preferred, and particularly preferred are hexaalkoxymethylmelamines such as the above identified Cymel™ resins, especially Cymel™ 300.

The cross linker need not necessarily be a separate molecule to the substituted triphenylene, and in certain embodiments the cross linker is a moiety attached to the triphenylene (i.e. the triphenylene compound is self cross-linking. Examples of suitable cross-linking moieties include epoxy, hydroxystyrene and pendant alcohols.

The preferred mass ratio of triphenylene to crosslinker (when present as a separate molecule) is from about 1:0.1 to 1:3.

Step (i) may be achieved by application of the resist components in solution followed by removal of solvent. Solvent may be removed by heating, a process which is commonly referred to as a soft pre-bake. Convenient coating techniques include spin coating (preferred) dipping, or roller coating. Other conventional techniques for forming the coating layer include vacuum sublimation. When spin coating, it will be appreciated that the solids content of the coating solution can be adjusted to provide a desired film thickness based upon the specific spinning equipment utilized, and parameters such as the viscosity of the solution, the speed of the spinner and the amount of time allowed for spinning. The film thickness is not particularly limited and may be 10 nm or less to several thousand (e.g. 6000) nanometers.

The nature of the substrate is not particularly limited, but in the preparation of electronic components, the substrate will normally be a silicon or silicon dioxide wafer for the production of microprocessors and other integrated circuit components. Aluminum-aluminum oxide, gallium arsenide and silicon nitride wafers can also serve as substrate.

Solvents which may be used in step (i) include chloroform, chlorobenzene, dichlorobenzene, anisole and ethyl-3-ethoxy propionate.

The solvent in step (i) is preferably anisole or ethyl-3-ethoxy propionate.

When step (i) is achieved by forming a solution of the triphenylene, a concentration of between about 1 and 50 mg/ml of triphenylene is preferred. Especially preferred is a concentration of about 2 mg/ml.

Step (iii) is conveniently achieved by selectively dissolving the unirradiated areas of the coating layer in a second solvent (e.g. by immersion or spraying) or by brushing out. Solvents which may be used in step (iii) include chloroform, chlorobenzene, dichlorobenzene, anisole and ethyl-3-ethoxy propionate.

Preferably, the solvent used in step (iii) is selected from anisole and 3-ethoxy propionate.

To the best of the inventors' knowledge, anisole and 3-ethoxy propionate have not been previously proposed for the casting or developing of triphenylene-based resists.

Step (ii) is preferably conducted using electron beam energy, although excimer laser beams and X-rays may also be used. The patternwise irradiation may be achieved by scanning the actinic ray source according to the required pattern, or by using a mask formed to the pattern over the substrate.

The method may include the additional step, between steps (ii) and (iii) of a post exposure bake, in which the substrate is heated to an elevated temperature (e.g. 60 to 105° C., preferably about 100° C., for a predetermined period (e.g. 0.1 to 20 minutes, preferably about 1-2 minutes). It will be appreciated that varying the pre-bake conditions will affect the sensitivity and resolution of the resist. This allows the resist to be tuned to either a fast or a high resolution process according to the proposed application.

Subsequent to step (iii), the developed substrate may be selectively processed on those substrate areas bared of the coating composition, for example by chemically etching or plating using procedures well known in the art. For the manufacture of microelectronic substrates, for example the manufacture of silicon dioxide wafers, suitable etchants include a plasma gas etch and a hydrofluoric acid etching solution. After such processing, the resist layer may be removed from the processed substrate using known stripping procedures. The historical background, types and processing of conventional photoresists are described by DeForest, Photoresist Materials and Processes, McGraw Hill Book Company, New York, ch. 2, 1975, and by Moreau, Semiconductor Lithography, Principles, Practices and Materials, Plenum Press, New York, ch. 2 and 4, 1988, both incorporated herein for their teaching of photoresist compositions and methods of making and using the same.

According to a second aspect of the present invention, there is provided a resist material comprising a solution of:—

(i) as the principal resist material a triphenylene derivative having a diameter of from 1 to 3 nm, (ii) a sensitizer which increases the sensitivity of the resist material to actinic radiation, and (iii) a cross linker capable of cross linking molecules of the triphenylene derivative, said cross linker optionally being constituted by a moiety attached to said triphenylene derivative.

The invention further resides in a substrate treated in accordance with the process of the first aspect.

Examples of suitable triphenylene derivatives are represented by formula (I)

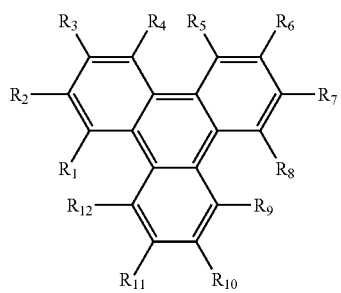

in which each of $R_1$ to $R_{12}$ is independently selected from H, hydroxyl, and a monovalent organic group such as alkyloxy (substituted or unsubstituted) especially $C_{1-6}$ alkoxy, alkyloxycarbonyl (substituted or unsubstituted) especially $C_{1-6}$ alkoxycarbonyl or the alkylthio and alkyloxythio equivalents, save that at least one of $R_1$ to $R_4$ and at least one of $R_5$ to $R_8$ and at least one of $R_9$ to $R_{12}$ is not H.

Preferably, $R_1$, $R_4$, $R_5$, $R_8$, $R_9$ and $R_{12}$ are all H.

Preferably, at least two of (and more preferably all of) $R_2$, $R_6$ and $R_{10}$ are identical and are more preferably $C_{1-8}$ alkyloxy (e.g. pentyloxy).

Preferably, at least two of (and more preferably all of) $R_3$, $R_7$ and $R_{11}$ are identical and are more preferably hydroxyl.

In an embodiment in which the cross linker forms part of the triphenylene derivative, at least one of $R_1$ to $R_4$ (preferably $R_2$ or $R_3$) and at least one of $R_5$ to $R_8$ (preferably $R_6$ or $R_7$) and at least one of $R_9$ to $R_{12}$ (preferably $R_{10}$ or $R_{11}$) is

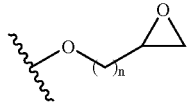

where n is from 1 to 5.

Embodiments of the invention will now be described by way of example only, with reference to the accompanying drawings.

EXAMPLE 1

Forming Films of a Triphenylene Resist using a Safe Casting Solvent

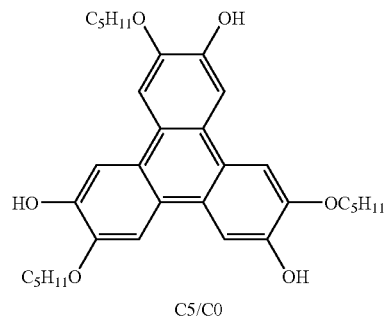

C5/C0

A solution of the derivative C5/C0 (prepared by the method of Kumar, S. and Manickam, M., "Synthesis of Functionalized Triphenylenes by Selective Ether Cleavages with B-Bromocatecholborane", *Synthesis*, 1998, 1119-1122) was prepared using the safe solvent anisole. 1.1 mg of the derivative was dissolved in 0.12 ml of the solvent. 90 μl of this solution was deposited on a square 4 cm² hydrogen terminated silicon substrate, which was then spun at 600 RPM for 60 seconds, followed by 3000 RPM for 10 seconds to form a smooth film on the substrate. A second solution of 1.1 mg of C5/C0, was prepared in 0.12 ml of ethyl-3-ethoxyproprionate. This solution was used to create a film with the same conditions as used for the anisole. Both solvents formed good casting solvents for the pure derivatives. Hereinafter, chemically amplified resist material (whether self cross-linking or using a PAG and cross-linker) will be suffixed [CA], i.e. C5/CO[CA] is a chemically amplified resist formed using C5/C0 as the principle resist material.

The experiment was then repeated with the addition of crosslinker and photoacid generator in each case. A solution comprising 0.9 mg of C5/C0, 0.26 mg of triphenylsulphonium triflate (abbreviated hereinafter as PAG03-01) and 0.1 μl of the crosslinker hexamethoxymethylmelamine (hereinafter referred to as CL03-01, and known by the trade name Cymel 300), in 110 μl of anisole was prepared and spun successfully. A final solution comprising 0.7 mg of C5/C0, 0.14 mg PAG03-01, and 0.1 μl of CL03-01 was made with 100 μl of ethyl 3-ethoxyproprionate and again successful spin coated to form a smooth film using the previously mentioned conditions.

The above example demonstrates the usefulness of anisole and ethyl 3-ethoxyproprionate as casting solvents for triphenylene derivatives, whether or not chemically amplified.

EXAMPLE 2

Developing Films of a Triphenylene Resist using a Safe Developer

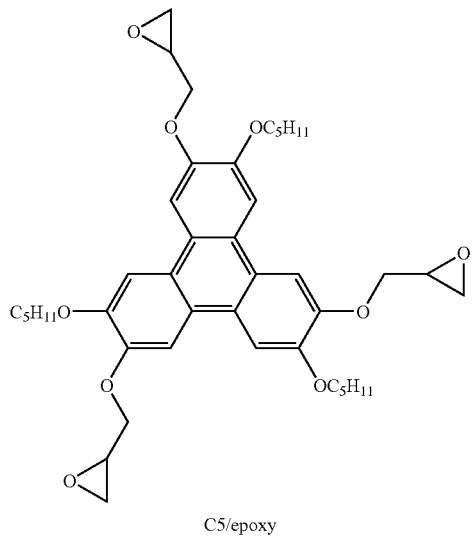

C5/epoxy

A solution of symmetrical 2,6,10-trihydroxy-3,7,11-tris (pentyloxy)triphenylene (100 mg, 0.19 mmol) in DMF (25 mL) was added to $K_2CO_3$ (155 mg, 1.12 mmol). The resultant slurry was stirred and heated under reflux. A solution of epibromohydrin (103 mg, 0.75 mmol) in DMF (5 mL) was added dropwise over a few minutes to the slurry, maintaining heating under reflux. Heating was continued overnight. The reaction mixture was cooled, $H_2O$ (20 mL) was added, and the reaction mixture was extracted with $Et_2O$ (2×25 mL). The combined organic extracts were dried ($MgSO_4$), and filtered, and the filtrate evaporated to dryness under reduced pressure. The residue was purified by crystallization to afford the target compound, C5/epoxy (50 mg, 38%) as a white solid: $^1H$ NMR (300 MHz, $CDCl_3$, 25° C.): δ=0.95 (m, 15H), 1.48 (m, 12 H), 1.92 (m, 6H), 3.42 (m, 3H), 4.68 (m, 6H), 4.35 (m, 6H), 7.82 (s, 3H), 8.09 (s, 3H); MS (FABMS): m/z 725 [M+Na]$^+$;

In EP 01159649 and other work published by the inventors, chlorobenzene (MCB) is used as the developer for the triphenylene resists. It has now been found that two safer alternatives exist. For instance a film of C5/C0 was prepared by spin coating from a solution of strength 9.2 mg/ml of the C5/C0 in anisole, using a spin speed of 600 RPM for 60 seconds followed by 3000 RPM for 10 seconds, onto a square 4 $cm^2$ hydrogen terminated silicon sample. The film was exposed using 20 keV electron in a scanning electron microscope (SEM). After exposure, the film was dipped in a beaker of anisole for 10 seconds, and then rinsed with isopropyl alcohol and dried with nitrogen gas. It was observed that the unexposed areas of the film were fully removed, whilst the material was retained in the exposed areas. (For reference, isopropyl alcohol does not remove either area). Similarly ethyl 3-ethoxyproprionate can substitute for the anisole to give the same result.

EXAMPLE 3

Response to Electron Irradiation of C5/C0[CA]

The material C5/C0 has a sensitivity to electrons of 6500 $\mu C/cm^2$ as demonstrated in EP 01159649. A solution of C5/C0[CA] was prepared using a ratio of 1 mg C5/C0:0.5 mg PAG03-01:1.9 mg CL03-01. This mixture was dissolved in chloroform and spin coated to form a smooth film. The film was irradiated with 20 keV electrons, and then given a post exposure bake of 100° C. for 60 seconds, before development in MCB. FIG. 1 shows a graph of the response of C5/C0[CA]. From FIG. 1, it will be seen that the measured sensitivity of the C5/C0[CA] resist to electron beam irradiation was 5 $\mu C/cm^2$ which represents a substantial increase on the pure C5/C0 material.

EXAMPLE 4

Response to Electron Irradiation of C5/Epoxy and C5/epoxy[CA]

Figure 2:
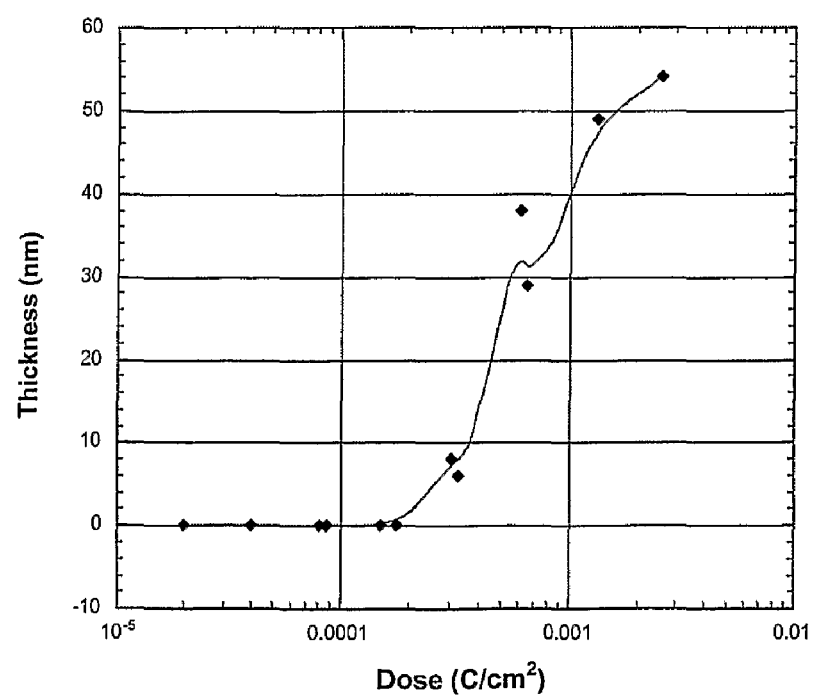
Figure 3:
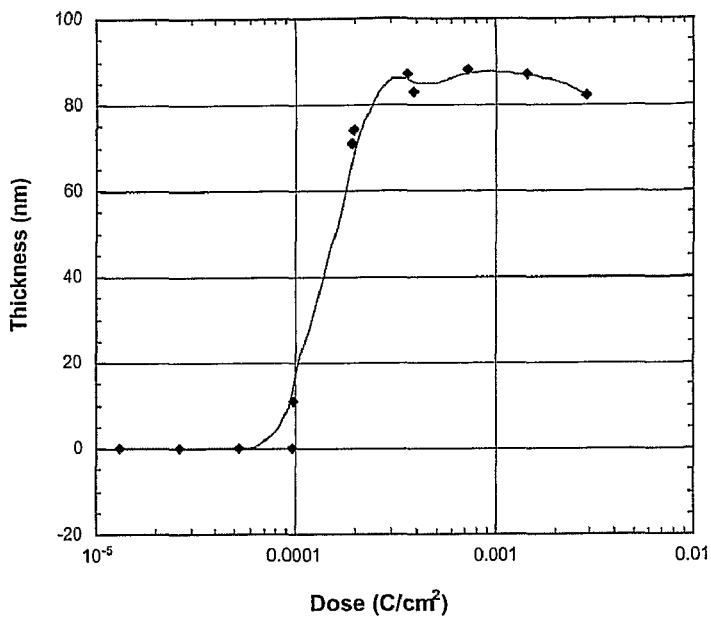

The non-chemically amplified sensitivity of this material was measured by preparing and exposing a film in the normal way, as described in previous examples, using a film spun from a solution of strength 6 mg/ml of the epoxide in chloroform. One hundred microlitres of the solution was dropped onto a square 4 $cm^2$ piece of hydrogen terminated silicon and spun at a speed of 600 RPM, for 60 seconds and 3000 RPM for 10 seconds, to give a film of thickness 60 nm. The response is shown in FIG. 2. It can be seen from the graph that the sensitivity of the material to 20 keV electrons and development with MCB is around 600 $\mu C/cm^2$. A chemically amplified film was then prepared, using 0.5 mg of PAG03-01 per mg of C5/Epoxy, and a solution strength of 6 mg/ml in chloroform. One hundred microlitres of the solution was dropped onto a square 4 $cm^2$ piece of hydrogen terminated silicon and spun at a speed of 600 RPM, for 60 seconds and 3000 RPM for 10 seconds, to give a film of thickness 85 nm. The film was irradiated using a FEI XL30 SFEG Scanning Electron Microscope, and given a post exposure bake of 100° C. for 90 seconds before development in MCB. The response of the material is shown in FIG. 3. In this case there is a relatively small increase in the sensitivity to 150 $\mu C/cm^2$. Replacing the Photoacid generator with the photoinitiator triarylsulfonium hexafluoroantimonate salt (Dow UVI-6976) at a triphenylene to photoinitiator ratio of 2:1 (but otherwise with the same concentration and preparation as above) allowed the preparation of films with a sensitivity of 15 $\mu C/cm^2$.

EXAMPLE 5

Response to Electron Irradiation of C5/C0[CA], C5/Epoxy[CA] Mixture

Figure 4:
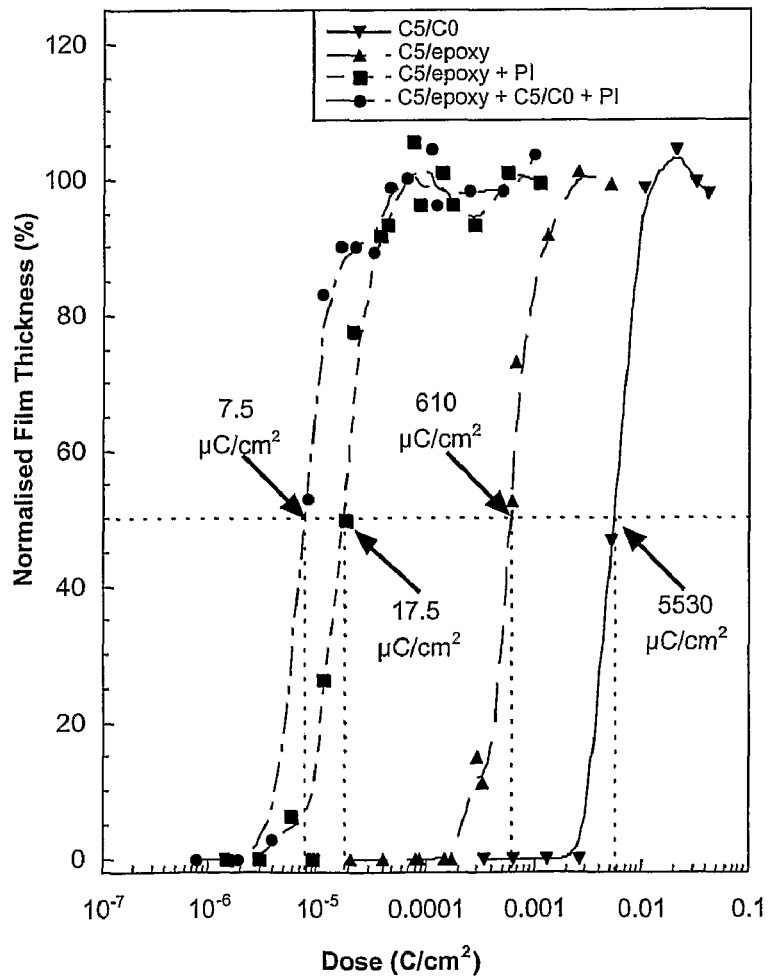
FIG. 4 is a plot of normalized film thickness against exposure dose for resist materials (chemically amplified and non-amplified) in accordance with the present invention exposed to electron beam irradiation at 20 keV.

The non-chemically amplified sensitivity of C5/epoxy and C5/C0 was measured by preparing and exposing films in the normal way, as described in previous examples, using films spun from chloroform onto hydrogen terminated silicon. For this example, the two triphenylenes were mixed and chemically amplified. Chemical amplification was achieved using the photoinitiator triarylsulfonium hexafluoroantimonate salts. The composition was 14 C5/epoxy:4 C5/C0:9 photoinitiator by mass. The responses are shown in FIG. 4. It can be seen from the graph that the sensitivity of the C5/Epoxy to 20 keV electrons and development with MCB is around 600 μC/cm², and the C5/C0 is around 5500 μC/cm². The chemically amplified C5/epoxy film without C5/C0 has a sensitivity of 17.5 μC/cm², whereas for the mixture it is 7.5 μC/cm². This improves the quality of the fine patterning achievable. Thus, whereas the chemically amplified C5/epoxy film can achieve a minimum feature size of 95 nm, the mixture was able to achieve a minimum feature size of 40 nm (results not shown).

Removal of Chemical Amplified triphenylene Resists with Plasma Ashing

It is important to be able to remove the remaining resist pattern after subsequent processing. It has been found that oxygen plasma ashing was more than sufficient to remove the exposed triphenylene based films. A Technics PP100E low temperature asher was used to remove the films. The silicon sample bearing the resist pattern was loaded into the plasma asher, and the chamber was evacuated to a pressure of approximately 0.1 Torr. A small flow of oxygen was then allowed to enter the chamber via a needle valve, which was adjusted so that the chamber pressure stabilized at 0.6 Torr. An RF power of 340 W was then used to strike a plasma in the oxygen. The sample was exposed to the oxygen plasma for a period of time and all traces of the exposed resist were easily removed. The duration of the ashing procedure was dependent upon the resist film thickness, but in general, ashing times of five to ten minutes ensured an entirely clean sample.

Etch Durability of Chemical Amplified Triphenylene Resists

A film of the resist C5/C0[CA] was prepared, patterned and developed exactly as stated in example 3. It was then etched using an Oxford Instruments Plasmalab 80⁺ with Electron Cyclotron Resonance (ECR) attachment. As plasma etching can be very sensitive to the etching conditions, a control sample of SAL601 resist (Shipley, US) was prepared and etched alongside the C5/C0[CA] resist so as to ensure that the etch rate was the same in each case. The following etching conditions were used for this experiment: RF Power=7 W, DC Self Bias=108V, Microwave Power=250 W, Etching Gas=$SF_6$, Etching Gas Flow Rate=5 sccm, Chamber Pressure=0.001 Torr, Etch Time=20 minutes.

To find the etch durability, a square pattern of 100 microns on a side was defined in each of the resist films and the thickness of the film was measured with a surface profiler (height 1). The sample was then etched, and the height of the feature was again measured (height 2). Finally any remaining film was removed using plasma ashing as described above and the height was once again measured (height 3). The etch durability of the material in terms of the etch durability of the silicon substrate is then given by:

height 3/(height 1−(height 2−height 3))

The etch durability of the SAL601 under these conditions was 3.5 that of silicon. The etch durability of the C5/C0[CA] was 2.2 that of the silicon, thereby demonstrating that the etch durability had not been reduced below a satisfactory level

The invention claimed is:

1. A method for the formation of a patterned resist layer on a substrate surface by patternwise irradiation with actinic radiation comprising the steps of:
   (i) forming a coating layer comprising a substituted triphenylene compound having a diameter of between 1 and 3 nm, a sensitizer which increases the sensitivity of the exposed layer to the actinic radiation of step (ii) and a cross-linker on the substrate surface,
   (ii) irradiating the coating layer patternwise, and
   (iii) removing unirradiated areas of the coating layer,
   wherein the triphenylene derivative is represented by the formula,

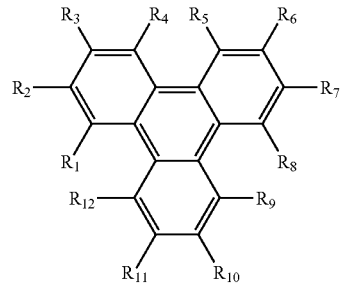

in which each of $R_1$ to $R_{12}$ is independently selected from H, hydroxyl, and a monovalent organic group, save that at least one of $R_1$ to $R_4$ and at least one of $R_5$ to $R_8$ and at least one of $R_9$ to $R_{12}$ is not H.

2. The method as claimed in claim 1, wherein the mass ratio of triphenylene to sensitizer is from 1:0.1 to 1:0.5.

3. The method as claimed in claim 1, wherein the sensitizer is a photoinitiator selected from a triarylsulfonium hexafluoroantimonate salt or 3,6-bis(2-methyl2-morpholinopropionyl)-9-octylcarbazole, or a photo acid generator (PAG).

4. The method as claimed in claim 3, wherein the PAG is selected from the group consisting of 1,1-bis[p-chlorophenyl]-2,2,2-trichloroethane (DDT); 1,1-bis[p-methoxyphenyl]-2,2,2-trichloroethane; 1,2,5,6,9,10-hexabromocyclododecane; 1,10-dibromodecane; 1,1-bis[p-chlorophenyl] 2,2-dichloroethane; 4,4'-dichloro-2-(trichloromethyl) benzhydrol, 1,1-bis(chlorophenyl)2-2,2-trichloroethanol; hexachlorodimethylsulfone; 2-chloro-6-(trichloromethyl) pyridine; O,O-diethyl-O-(3,5,6-trichloro-2-pyridyl)phosphorothioate; 1,2,3,4,5,6-hexachlorocyclohexane; N(1,1-bis [p-chlorophenyl]-2,2,2-trichloroethylacetamide; tris[2,3-dibromopropyl]isocyanurate; and 2,2-bis[p-chlorophenyl]-1, 1-dichloroethylene.

5. The method as claimed in claim 1 wherein the cross linker is selected from the group consisting of urea-formaldehyde, melamine-formaldehyde, benzoguanamine-formaldehyde, glycoluril-formaldehyde resins and combinations thereof, melamines, benzoguanamine resins; glycoluril resins and urea-based resins.

6. The method as claimed in claim 5, wherein the cross linker is a hexaalkoxymethylmelamine.

7. The method as claimed in claim 1 wherein the mass ratio of triphenylene to crosslinker is from 1:0.1 to 1:3.

8. The method as claimed in claim 1 wherein the cross linker is a moiety attached to the triphenylene.

9. The method as claimed in claim 8, wherein the crosslinking moiety is epoxy, hydroxystyrene or a pendant alcohol.

10. The method as claimed in claim 1, wherein step (i) is achieved by application of the resist components in solution followed by removal of solvent.

11. The method as claimed in claim 10, wherein the solvent is chloroform, chlorobenzene, dichlorobenzene, anisole or ethyl-3-ethoxy propionate.

12. The method as claimed in claim 1, wherein step (iii) is achieved by selectively dissolving the unirradiated areas of the coating layer in a second solvent or brushing out.

13. The method as claimed in claim 12, wherein the solvent used in step (iii) is chloroform, chlorobenzene, dichlorobenzene, anisole or ethyl-3-ethoxy propionate.

14. The method as claimed in claim 13, wherein the solvent used in steps (i) and (iii) is selected from anisole and 3-ethoxy propionate.

15. The method as claimed in claim 1, wherein, $R_1$, $R_4$, $R_5$, $R_8$, $R_9$ and $R_{12}$ are all H.

16. The method as claimed in claim 1, wherein, at least two of $R_2$, $R_6$ and $R_{10}$ are $C_{1-8}$ alkyloxy.

17. The method as claimed in claim 1, wherein at least two of $R_3$, $R_7$ and $R_{11}$ are hydroxyl.

18. The method as claimed in claim 17, wherein $R_2$, $R_6$ and $R_{10}$ are pentyloxy and $R_3$, $R_7$ and $R_{11}$ are hydroxyl.

19. The method as claimed in claim 1 wherein at least one of $R_1$ to $R_4$ and at least one of $R_5$ to $R_8$ and at least one of $R_9$ to $R_{12}$ is

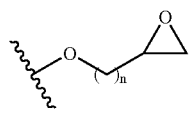

where n is from 1 to 5, thereby defining the cross linker as a moiety attached to the triphenylene.

20. A resist material comprising a solution of:
(i) as the principal resist material a triphenylene derivative having a diameter of from 1 to 3 nm,
(ii) a sensitizer which increases the sensitivity of the resist material to actinic radiation, and
(iii) a cross linker capable of cross linking molecules of the triphenylene derivative, said cross linker optionally being constituted by a moiety attached to said triphenylene derivative, wherein the triphenylene derivative is represented by formula (I)

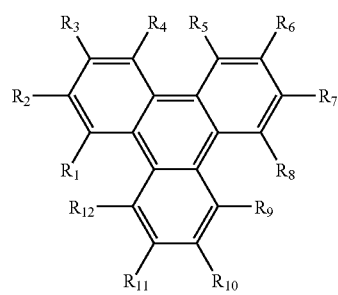

in which each of $R_1$ to $R_{12}$ is independently selected from H, hydroxyl, and a monovalent organic group selected from the group consisting of alkyloxy (substituted or unsubstituted), alkyloxycarbonyl (substituted or unsubstituted) and the alkylthio and alkyloxythio equivalents thereof, save that at least one of $R_1$ to $R_4$ and at least one of $R_5$ to $R_8$ and at least one of $R_9$ to $R_{12}$ is not H.

21. A substrate treated in accordance with the method of claim 1.

22. The method of claim 1, wherein said monovalent organic group is selected from the group consisting of alkyloxy (substituted or unsubstituted), alkyloxycarbonyl (substituted or unsubstituted) or the alkylthio and alkyloxythio equivalents thereof.

* * * * *